(12) United States Patent
Fang et al.

(10) Patent No.: US 10,090,368 B2
(45) Date of Patent: Oct. 2, 2018

(54) ARRAY SUBSTRATE AND MANUFACTURING METHOD THEREOF, AND DISPLAY APPARATUS

(71) Applicant: BOE TECHNOLOGY GROUP CO., LTD., Beijing (CN)

(72) Inventors: Jingang Fang, Beijing (CN); Longbao Xin, Beijing (CN); Hongda Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/785,830

(22) PCT Filed: Feb. 27, 2015

(86) PCT No.: PCT/CN2015/073340
§ 371 (c)(1),
(2) Date: Oct. 20, 2015

(87) PCT Pub. No.: WO2016/078248
PCT Pub. Date: May 26, 2016

(65) Prior Publication Data
US 2016/0358991 A1    Dec. 8, 2016

(30) Foreign Application Priority Data

Nov. 21, 2014    (CN) .......................... 2014 1 0678072

(51) Int. Cl.
*H01L 27/12* (2006.01)
*H01L 27/32* (2006.01)

(52) U.S. Cl.
CPC ........ *H01L 27/3262* (2013.01); *H01L 27/124* (2013.01); *H01L 27/1225* (2013.01);
(Continued)

(58) Field of Classification Search
CPC ............. H01L 27/3262; H01L 27/1225; H01L 27/124; H01L 27/3276; H01L 27/1288
See application file for complete search history.

(56) References Cited

U.S. PATENT DOCUMENTS 5,917,210 A * 6/1999 Huang .................... H01L 27/12
257/292
2005/0139918 A1    6/2005 Lee
(Continued)

FOREIGN PATENT DOCUMENTS

CN    102237306 A * 11/2011
CN    102983135 A    3/2013
(Continued)

OTHER PUBLICATIONS

International Search Report and Written Opinion from PCT Application Serial No. PCT/CN2015/073340, dated Aug. 14, 2015, 12 pages.
(Continued)

*Primary Examiner* — Kyoung Lee
*Assistant Examiner* — Christina Sylvia
(74) *Attorney, Agent, or Firm* — Kinney & Lange, P.A.

(57) ABSTRACT

The present invention provides an array substrate and a manufacturing method thereof, and a display apparatus; and it relates to the field of display. The array substrate includes a first thin film transistor and a first electrode which are formed on a substrate. The first thin film transistor includes a gate, a gate insulating layer, an active layer, and an etch stop layer. The etch stop layer is formed with first via holes, and the etch stop layer and the gate insulating layer are formed with a second via hole at a position corresponding to the first electrode. A maximal diameter of the first via holes is not greater than a minimal diameter of the second via hole.

12 Claims, 6 Drawing Sheets

(52) U.S. Cl.
CPC ...... *H01L 27/1288* (2013.01); *H01L 27/3276* (2013.01); *H01L 2227/323* (2013.01)

(56) References Cited

U.S. PATENT DOCUMENTS

| | | | |
|---|---|---|---|
| 2007/0029609 A1* | 2/2007 | Park | G02F 1/136213 |
| | | | 257/340 |
| 2008/0023846 A1* | 1/2008 | Seki | H01L 21/3065 |
| | | | 257/774 |
| 2015/0221669 A1* | 8/2015 | Sun | H01L 29/66765 |
| | | | 257/72 |
| 2016/0013209 A1* | 1/2016 | Yang | H01L 29/41733 |
| | | | 257/43 |
| 2016/0035811 A1* | 2/2016 | Choi | H01L 51/5221 |
| | | | 257/72 |
| 2016/0041433 A1* | 2/2016 | Zhang | G02F 1/1343 |
| | | | 257/48 |
| 2016/0246097 A1* | 8/2016 | Guo | G02F 1/13394 |

FOREIGN PATENT DOCUMENTS

| | | |
|---|---|---|
| CN | 103367248 A | 10/2013 |
| CN | 103676354 A | 3/2014 |
| CN | 103715267 A | 4/2014 |
| CN | 103811499 A | 5/2014 |
| CN | 104022126 A | 9/2014 |
| WO | PCTCN2012086306 A * | 12/2012 |

OTHER PUBLICATIONS

First Office Action dated Sep. 28, 2016, for corresponding Chinese Application No. 201410678072.1.
Extended European Search Report, for European Patent Application No. 15793663.4, dated Jun. 15, 2018, 10 pages.

* cited by examiner

ARRAY SUBSTRATE AND MANUFACTURING METHOD THEREOF, AND DISPLAY APPARATUS

CROSS-REFERENCE TO RELATED APPLICATIONS

The present application is a national-stage entry of PCT Application No. PCT/CN2015/073340, filed Feb. 27, 2015, which in turn claims priority to Chinese Pat. App. No. 201410678072.1, filed Nov. 21, 2014, each of which is hereby incorporated by references in its entirety.

BACKGROUND

1. Technical Field

The embodiments of the present invention relates to the field of display, and particularly to an array substrate and a manufacturing method thereof, and a display apparatus.

2. Description of the Related Art

Figure 1:
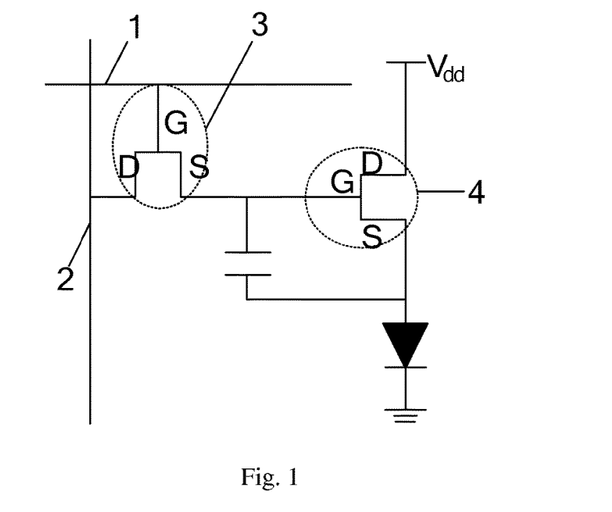
FIG. 1 is a principle diagram of a drive circuit of a conventional AMOLED.

Active Matrix Organic Light Emitting Diode (AMOLED) display apparatus is an important structural form of an OLED display apparatus, and comprises an array substrate and a package substrate. A plurality of display units are formed on the array substrate. As shown in FIG. 1, the display unit comprises a switching thin film transistor 3, a driving thin film transistor 4, and an OLED. The switching thin film transistor 3 has a gate G electrically connected with a gate line 1, a drain D electrically connected with a data line 2, and a source S electrically connected with a gate G of the driving thin film transistor 4. The driving thin film transistor 4 further has a drain D electrically connected with a $V_{dd}$ line (power supply and signal line), and a source S electrically connected with an anode or cathode of the OLED. When electrical signals are loaded on the gate line 1, the data line 2, and the $V_{dd}$ line simultaneously, the OLED is driven, by the source S of the driving thin film transistor 4, to emit light.

Figure 2:
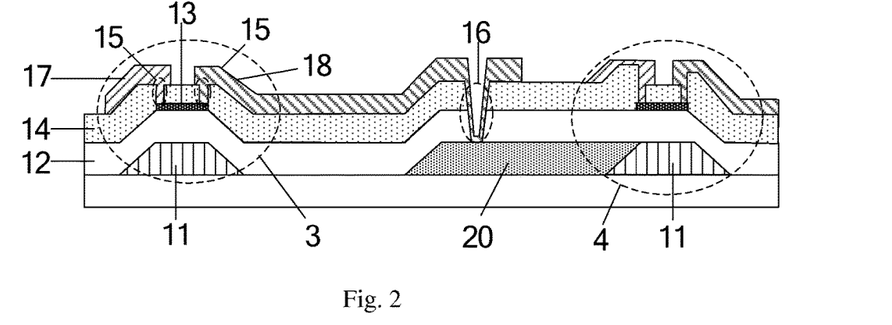
FIG. 2 is a schematic structural view of a conventional AMOLED array substrate.

In the above mentioned AMOLED display apparatus, as shown in FIG. 2, an active layer 13 is generally formed of Indium Gallium Zinc Oxide (IGZO) having greater electron mobility, while an etch stop layer 14 is generally further formed on the active layer 13 to prevent the active layer 13 from being eroded when a drain 17 and a source 18 are wet-etched by acid solution.

Specifically, as shown in FIG. 2, the drain 17 and the source 18 of the switching thin film transistor 3 are electrically connected to the active layer 13 through first via holes 15, the source 18 of the switching thin film transistor 3 is electrically connected to a first electrode 20 through a second via hole 16, and the first electrode 20 is electrically connected to a gate 11 of the driving thin film transistor 4. During manufacturing, the first via holes 15 and the second via hole 16 are formed by simultaneously etching by means of a single mask. It is only necessary to etch a single layer, i.e., the etch stop layer 14, so as to form the first via holes 15, thereby achieving electric connection between the source and the drain and the active layer, and it is necessary to etch two layers, i.e., the etch stop layer 14 and a gate insulating layer 12, so as to form the second via hole 16. Therefore, when the second via hole 16 is formed by etching, the first via holes 15 will be over-etched. In other words, the first via holes 15 will pass through the etch stop layer 14 and the gate insulating layer 12 so that the source 18 and the drain 17 are both electrically connected to the gate 11, thereby resulting in failure of the switching thin film transistor.

In order to avoid the abovementioned problem, in a conventional manufacturing technology, the first via holes and the second via hole are formed by means of use of two mask processes or use of a half-tone mask and a gray-tone mask. However, the use of the two mask processes increases complexity of technology and production cost, while the use of the half-tone mask and the gray-tone mask also increases production cost since the half-tone mask and the gray-tone mask are expensive although only one mask process is used.

SUMMARY

Embodiments of the present invention provide an array substrate, comprising: a substrate, and a switching thin film transistor and a first electrode which are formed on the substrate. The switching thin film transistor comprises: a gate, a gate insulating layer, an active layer, an etch stop layer, a source and a drain, wherein: the etch stop layer is formed with first via holes, and the source and the drain are electrically connected to the active layer through the first via holes; the etch stop layer and the gate insulating layer cover the first electrode, and are formed with a second via hole at a position corresponding to the first electrode, the source of the switching thin film transistor is electrically connected to the first electrode through the second via hole, and a maximal diameter of the first via hole is not greater than a minimal diameter of the second via hole.

Embodiments of the present invention also provide a method of manufacturing an array substrate. The method comprises: forming a switching thin film transistor and a first electrode on a substrate; wherein the forming the switching thin film transistor and the first electrode specifically comprises forming a gate, the first electrode, a gate insulating layer, an active layer, and an etch stop layer on the substrate, wherein the etch stop layer and the gate insulating layer cover the first electrode; forming first via holes and a second via hole, wherein the first via holes are formed at a position corresponding to the active layer, and pass through the etch stop layer; wherein the second via hole is formed at a position corresponding to the first electrode, and passes through the etch stop layer and the gate insulating layer; and forming a source and a drain, wherein the source and the drain are electrically connected to the active layer through the first via holes, and the source of the switching thin film transistor is electrically connected to the first electrode through the second via hole; and a maximal diameter of the first via hole is not greater than a minimal diameter of the second via hole.

Embodiments of the present invention further provide a display apparatus comprising any one of the above-mentioned array substrates.

LIST OF REFERENCE NUMERALS

1. Gate line; 2. Data line; 3. Switching thin film transistor; 4. Driving thin film transistor; 10. Substrate; 11. Gate; 12. Gate insulating layer; 13. Active layer; 14. Etch stop layer; 15. First via hole; 16. Second via hole; 17. Drain; 18. Source; 19. Gate of the driving thin film transistor; 20. First electrode; 21. Photoresist; 22. Mask; 23. Passivation layer; and 30. First thin film transistor.

DETAILED DESCRIPTION OF THE EMBODIMENTS

A further description of the invention will be made in detail as below with reference to embodiments of the present invention taken in conjunction with the accompanying drawings. The following embodiments are intended to explain the present invention, and the present invention should not be construed as being limited to the embodiment set forth herein.

Figure 3:
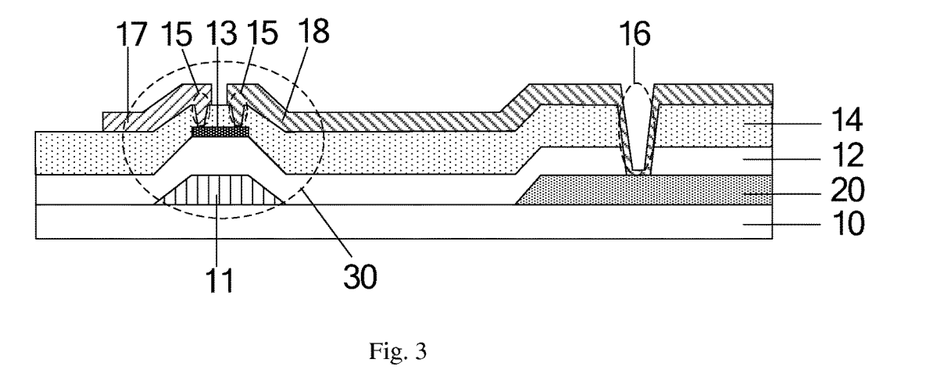
FIG. 3 is a schematic structural view of an array substrate according to an embodiment of the present invention.

Embodiments of the present invention provide an array substrate. As shown in FIG. 3, the array substrate comprises: a substrate 10, and a first thin film transistor 30 and a first electrode 20 which are formed on the substrate 10. The first thin film transistor 30 comprises: a gate 11, a gate insulating layer 12, an active layer 13, an etch stop layer 14, a source 18 and a drain 17. The etch stop layer 14 is formed with first via holes 15, and the source 18 and the drain 17 are electrically connected to the active layer 13 through the first via holes 15. The etch stop layer 14 and the gate insulating layer 12 cover the first electrode 20, and are formed with a second via hole 16 at a position corresponding to the first electrode 20. A maximal diameter of the first via hole 15 is not greater than a minimal diameter of the second via hole 16.

According to some embodiments of the present invention, if the maximal diameter of the first via hole 15 is less than or equal to 8 μm, a difference between the minimal diameter of the second via hole 16 and the maximal diameter of the first via hole is not less than 2 μm; and if the maximal diameter of the first via hole 15 is greater than 8 μm and less than or equal to 14 μm, a ratio of the minimal diameter of the second via hole 16 to the maximal diameter of the first via hole is not less than 1.3.

It should be noted that, theoretically, the formed via hole is cylindrical in shape, that is, a section taken along an axial direction of the via hole is rectangular in shape. However, practically, due to limitations from conditions such as technology, the formed via hole may have a shape of a truncated cone (i.e., the section taken along the axial direction of the via hole is trapezoidal in shape), or other irregular shapes. Therefore, practically, the diameter of the formed via hole has a maximum and a minimum. In addition, specific positions of the first via holes and the second via hole on the array substrate are not specifically limited in the embodiments of the present invention. For example, the first via holes and the second via hole may be located in a same pixel unit, or the first via holes may be located in a pixel unit while the second via hole may be located at an edge position of the array substrate, or the like.

In the embodiments of the present invention, a maximal diameter of the first via hole is not greater than a minimal diameter of the second via hole. If the maximal diameter of the first via hole is less than or equal to 8 μm, a difference between the minimal diameter of the second via hole and the maximal diameter of the first via hole is not less than 2 μm. Specifically, for example, if the maximal diameter of the first via hole is 3 μm, the minimal diameter of the second via hole is larger than or equal to 5 μm; and if the maximal diameter of the first via hole is 8 μm, the minimal diameter of the second via hole is larger than or equal to 10 μm.

If the maximal diameter of the first via hole is greater than 8 μm and less than or equal to 14 μm, a ratio of the minimal diameter of the second via hole to the maximal diameter of the first via hole is not less than 1.3. Specifically, for example, if the maximal diameter of the first via hole is 10 μm, the minimal diameter of the second via hole is larger than or equal to 13 μm.

It should be further noted that, ranges of the diameters of the first and second via holes may be specifically appropriately adjusted according to sensitivity, exposure, developing time and the like of photoresist material so long as the abovementioned range requirements are satisfied. Here, the ranges of the diameters of the first and second via holes are not specifically limited.

The abovementioned array substrate may be an array substrate of a liquid crystal display apparatus. In this case, the first electrode may be a gate-line lead. During the forming of the source and the drain, the source and the drain are electrically connected to the active layer through the first via holes, and the gate-line lead located at the second via hole may be electrically connected to a signal line through a metal electrode layer formed at the second via hole. Here, the first via holes are located in a pixel unit, while the second via hole may be located at an edge position of the array substrate, or the like.

Alternatively, the array substrate further comprises a second thin film transistor. The first thin film transistor may be a switching thin film transistor, while the second thin film transistor may be a driving thin film transistor. In this case, the first electrode is a gate of the second thin film transistor, and the source of the first thin film transistor may be electrically connected to a gate of the second thin film transistor, so that the first thin film transistor controls a gate voltage of the second thin film transistor. The array substrate having such configuration is applicable to an AMOLED. The AMOLED has characteristics such as high-speed response, high contrast, power saving property, and the like. Alternatively, the first electrode is a connection electrode, and the source of the first thin film transistor is electrically connected to the gate of the second thin film transistor through the first electrode, and the embodiments and drawings of the present invention are explained in detail by taking this case as an example. Furthermore, in this case, the first via holes and the second via hole may be located in a same pixel unit.

As shown in FIG. 3, in the array substrate according to the embodiments of the present invention, a dimensional relationship between the maximal diameter of the first via hole 15 and the minimal diameter of the second via hole 16 is set such that a diameter of the second via hole 16 is greater than a diameter of the first via hole 15, thereby avoiding the problem that the first via holes 15 are over-etched for a long time so as to result in failure of the first thin film transistor 30 when the first via holes 15 and the second via hole 16 are formed by simultaneously etching by means of a single mask. Specifically, since the diameter of the first via hole 15 is relatively small, when ultraviolet ray is irradiated onto the first via hole 15 during exposing, diffraction will easily occurs so that exposing energy is decreased. Therefore, within the same time, degree of exposure for the first via hole 15 is less than that for the second via hole 16. Then, a developing process is performed. Since the diameter of the first via hole 15 is relatively small, developing solution that takes part in reaction within the first via hole 15 is less so that the reaction is not complete. As a result, due to the abovementioned two reasons, a small amount of photoresist will remain within the first via hole 15 after being subjected to the developing process. However, since the diameter of the second via hole 16 is relatively great, a portion of the etch stop layer 14 within the second via hole 16 is completely exposed after being subjected to the developing process. Next, the exposed portion of the etch stop layer 14 within the second via hole 16 is etched. After that, an ashing process is performed to remove the photoresist remaining within the first via hole 15. Finally, a portion of the etch stop layer 14 within the first via hole 15 and a portion of the gate insulating layer 12 within the second via hole 16 are etched, thereby avoiding the problem that the first via hole 15 is over-etched for a long time so as to result in failure of the first thin film transistor 30 when the first via hole 15 and the second via hole 16 are formed by simultaneously etching by means of a single mask.

Furthermore, when the first via holes 15 and the second via hole 16 are formed by simultaneously etching by means of a single mask, exposing time for the first via hole 15 and the second via hole 16 can also be accurately controlled so that degree of exposure for the first via hole 15 is less than that for the second via hole 16. In addition, developing time for the first via hole 15 and the second via hole 16 can also be accurately controlled so that incomplete development occurs for the first via hole 15 and complete development occurs for the second via hole 16. In this way, after the abovementioned two processes, a small amount of photoresist will remain within the first via hole 15, while photoresist within the second via hole 16 is further cleaned up and thus the portion of the etch stop layer 14 within the second via hole 16 is completely exposed.

Optionally, in consideration of actual requirements and cost, the maximal diameter of the first via hole may be in a range of 3-8 μm. According to some embodiments of the present invention, if the maximal diameter of the first via hole is 3 μm, the minimal diameter of the second via hole is 5 μm; and if the maximal diameter of the first via hole is 8 μm, the minimal diameter of the second via hole is 10 μm.

Optionally, material for the active layer of the array substrate may be an oxide, and specifically, an oxide of a single element such as indium (In), gallium (Ga), zinc (Zn), tin (Sn), or the like; an oxide of any combinations of the several elements, such as indium gallium zinc oxide (IGZO), or indium tin zinc oxide (ITZO); or an oxynitride, and specifically, an oxynitride of a single element such as indium (In), gallium (Ga), zinc (Zn), tin (Sn), or the like; an oxynitride of any combinations of the several elements, such as zinc oxynitride (ZnON); or a phosphide such as indium phosphide (InP), gallium phosphide (GaP), or indium gallium zinc phosphide (IGZP).

Embodiments of the present invention provide a method of manufacturing an array substrate. The method comprises: forming a first thin film transistor and a first electrode on a substrate; wherein the forming the first thin film transistor and the first electrode specifically comprises: forming a gate, the first electrode, a gate insulating layer, an active layer, and an etch stop layer on the substrate, wherein the etch stop layer and the gate insulating layer cover the first electrode; forming first via holes and a second via hole, wherein the first via holes are formed at a position corresponding to the active layer, and pass through the etch stop layer; wherein the second via hole is formed at a position corresponding to the first electrode, and passes through the etch stop layer and the gate insulating layer; and forming a source and a drain, wherein the source and the drain are electrically connected to the active layer through the first via holes; and wherein a maximal diameter of the first via hole is not greater than a minimal diameter of the second via hole.

According to some embodiments of the present invention, if the maximal diameter of the first via hole is less than or equal to 8 μm, a difference between the minimal diameter of the second via hole and the maximal diameter of the first via hole is not less than 2 μm; and if the maximal diameter of the first via hole is greater than 8 μm and less than or equal to 14 μm, a ratio of the minimal diameter of the second via hole to the maximal diameter of the first via hole is not less than 1.3.

The embodiments of the present invention provide a method of manufacturing an array substrate. In the embodiments of the present invention, a dimensional relationship between the maximal diameter of the first via hole and the minimal diameter of the second via hole is set such that a diameter of the second via hole is greater than a diameter of the first via hole, thereby avoiding the problem that the first via holes are over-etched for a long time so as to result in failure of the thin film transistor when the first via holes and the second via hole are formed by simultaneously etching by means of a single mask. Specifically, since the diameter of the first via hole is relatively small, when ultraviolet ray is irradiated onto the first via hole during exposing, diffraction will easily occurs so that exposing energy is decreased. Therefore, within the same time, degree of exposure of the first via hole is less than that of the second via hole. Then, a developing process is performed. Since the diameter of the first via hole is relatively small, developing solution that takes part in reaction within the first via hole is less so that the reaction is not complete. As a result, due to the abovementioned two reasons, a small amount of photoresist will remain within the first via hole after being subjected to the developing process. However, since the diameter of the second via hole is relatively great, a portion of the etch stop layer within the second via hole is completely exposed after being subjected to the developing process. Next, the exposed portion of the etch stop layer within the second via hole is etched. After that, an ashing process is performed to remove the photoresist remaining within the first via hole. Finally, a portion of the etch stop layer within the first via hole and a portion of the gate insulating layer within the second via hole are etched simultaneously, thereby avoiding the problem that the first via hole is over-etched for a long time so as to result in failure of the thin film transistor when the first via hole and the second via hole are formed by simultaneously etching by means of a single mask.

Furthermore, when the first via holes and the second via hole are formed by simultaneously etching by means of a single mask, exposing time for the first via hole and the second via hole can also be accurately controlled so that degree of exposure of the first via hole is less than that of the second via hole. In addition, developing time for the first via hole and the second via hole can also be accurately controlled so that incomplete development occurs for the first via hole and complete development occurs for the second via hole. In this way, after the abovementioned two processes, a small amount of photoresist will remain within the first via hole, while photoresist within the second via hole is further cleaned up and thus the portion of the etch stop layer within the second via hole is completely exposed.

Optionally, in consideration of actual requirements and cost, the maximal diameter of the first via hole may be in a range of 3-8 μm. According to some embodiments of the present invention, if the maximal diameter of the first via hole is 3 μm, the minimal diameter of the second via hole is 5 μm; and if the maximal diameter of the first via hole is 8 μm, the minimal diameter of the second via hole is 10 μm. In the embodiments of the present invention, the etch stop layer and the gate insulating layer cover the first electrode. The gate and the first electrode may be formed in a same layer, and may be simultaneously formed in the same layer by a single patterning process or may be formed in the same layer by different patterning processes. The embodiments of the present invention are described by taking as an example that the gate and the first electrode are simultaneously formed in the same layer by a single patterning process.

Figure 4:
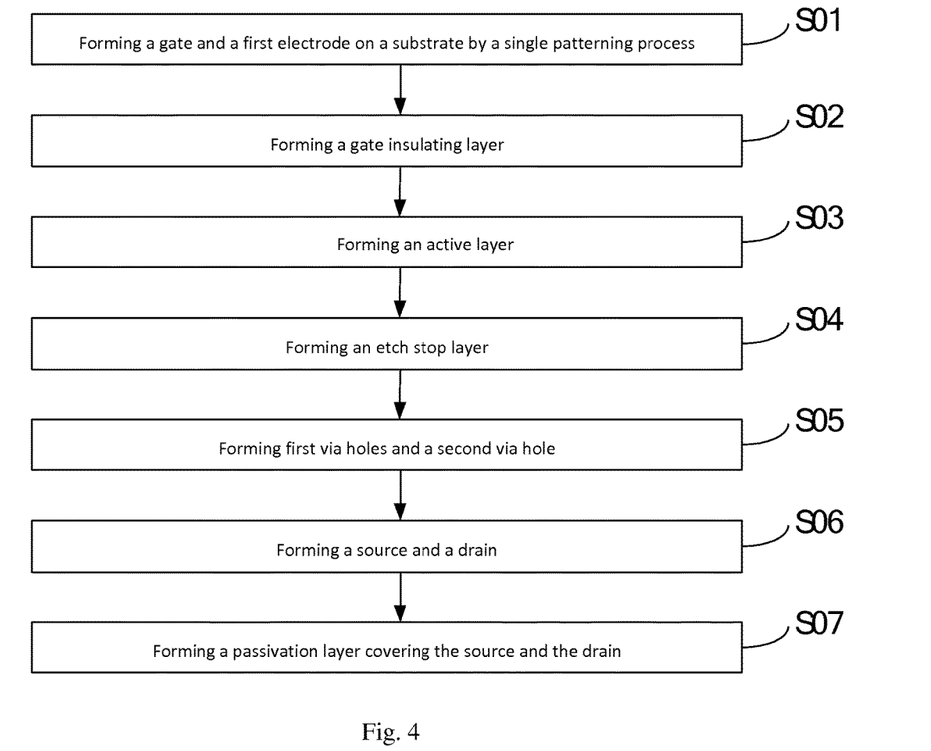
FIG. 4 is a schematic flow diagram of a method of manufacturing an array substrate according to an embodiment of the present invention.

A method of manufacturing a display panel is now specifically described by taking as an example that the first thin film transistor serves as a switching thin film transistor, and the first electrode serving as a connection electrode is electrically connected to the source of the first thin film transistor, as shown in FIG. 4. The method comprises the following steps.

Figure 5:
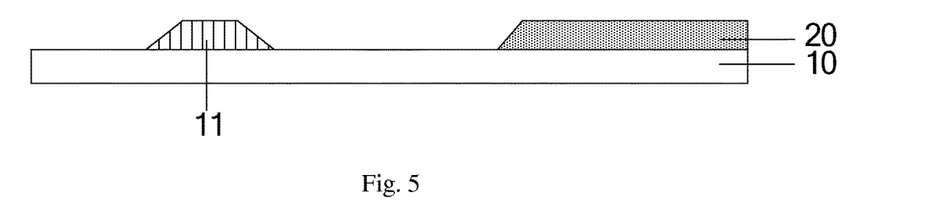
FIG. 5 is a schematic structural view of the array substrate formed in step S01 of FIG. 4.

In step S01, as shown in FIG. 5, a gate 11 and a first electrode 20 is formed on a substrate 10 by a single patterning process. The substrate 10 may be made of material such as Corning glass, Asahi class, quartz glass and the like, and may have a thickness of 50-1000 μm. The gate 11 and the first electrode 20 may be made of metal such as aluminum (Al), molybdenum (Mo), chromium (Cr), copper (Cu), titanium (Ti), and the like, and may have a thickness of 200-1000 nm.

Figure 6:
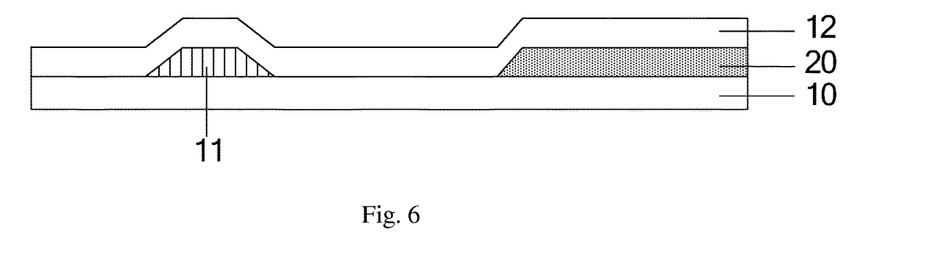
FIG. 6 is a schematic structural view of the array substrate formed in step S02 of FIG. 4.

In step S02, as shown in FIG. 6, a gate insulating layer 12 is formed on the substrate 10 by a Chemical Vapor Deposition (CVD) method. The gate insulating layer 12 may be one layer of, or a plurality of layers of film(s) made of SiOx or SiNx, and may have a thickness of 100-500 nm. Furthermore, the gate insulating layer 12 covers the gate 11 and the first electrode 20.

Figure 7:
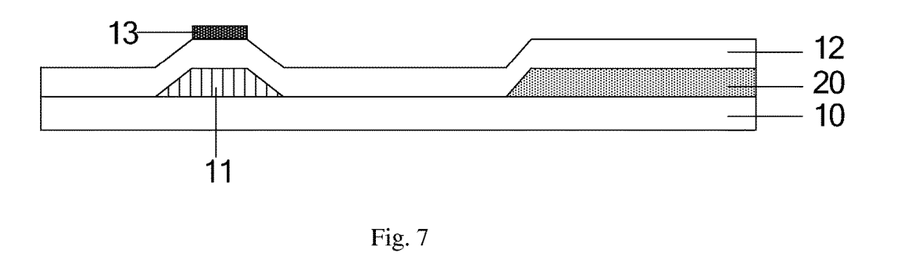
FIG. 7 is a schematic structural view of the array substrate formed in step S03 of FIG. 4.

In step S03, as shown in FIG. 7, an active layer 13 is formed. The active layer 13 may be a film of oxide such as IGZO, ITZO, ZnON, or the like, and an amorphous semiconductor film having a thickness of 5-150 nm, and may have a mobility of more than 10 m²/vs.

Figure 8:
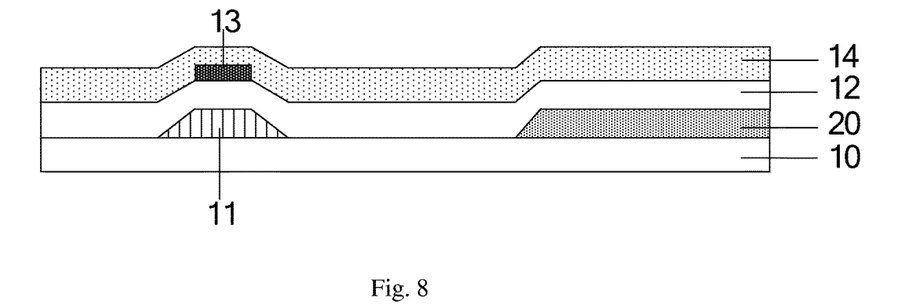
FIG. 8 is a schematic structural view of the array substrate formed in step S04 of FIG. 4.

In step S04, as shown in FIG. 8, an etch stop layer 14 is formed. The etch stop layer 14 may be a film of SiOx, and may have a thickness of 50-200 nm. The etch stop layer 14 covers the gate 11 and the first electrode 20.

Figure 9:
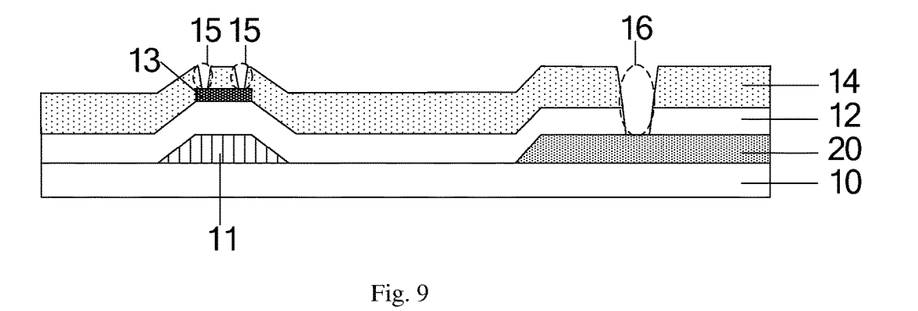
FIG. 9 is a schematic structural view of the array substrate formed in step S05 of FIG. 4.

In step S05, as shown in FIG. 9, first via holes 15 and a second via hole 16 are formed. The first via holes 15 are formed at a position corresponding to the active layer 13, and pass through the etch stop layer 14. The second via hole 16 is formed at a position corresponding to the first electrode 20, and passes through the etch stop layer 14 and the gate insulating layer 12.

Figure 10:
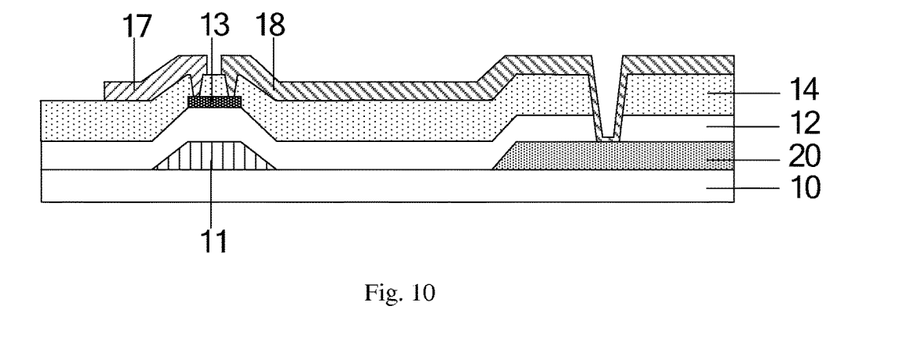
FIG. 10 is a schematic structural view of the array substrate formed in step S06 of FIG. 4.

In step S06, as shown in FIG. 10, a source 18 and a drain 17 are formed. The source 18 and the drain 17 are electrically connected to the active layer 13 through the first via holes 15, and the source 18 is electrically connected to the first electrode 20 through the second via hole 16. The source 18 and the drain 17 may be made of metal such as aluminum (Al), molybdenum (Mo), chromium (Cr), copper (Cu), titanium (Ti), and the like, and may have a thickness of 5-250 nm.

Figure 11:
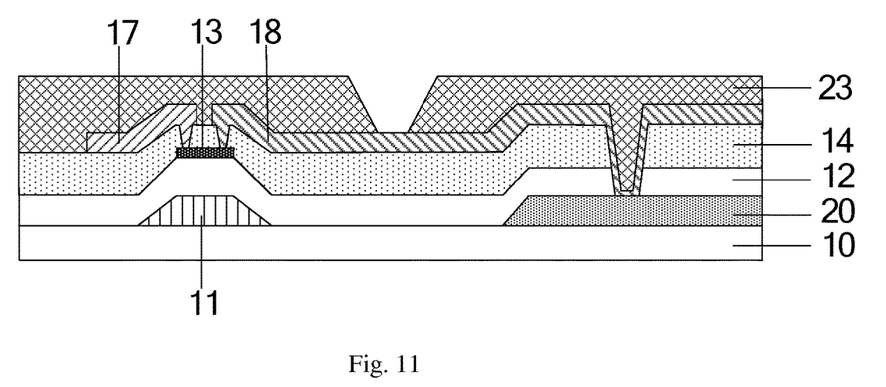
FIG. 11 is a schematic structural view of the array substrate formed in step S07 of FIG. 4.

In step S07, as shown in FIG. 11, a passivation layer 23 covering the source 18 and the drain 17 is formed. The passivation layer 23 may be made of insulating material such as a silicon oxide, silicon nitride, organic material, and the like.

Figure 12:
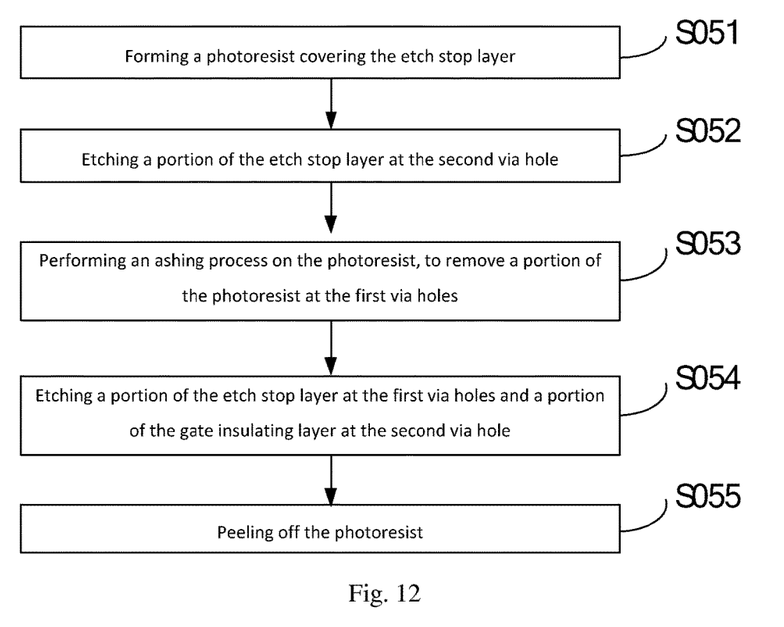
FIG. 12 is a schematic flow diagram of a manufacturing method in step S05 of FIG. 4.

Furthermore, as shown in FIG. 12, the step S05 further comprises the following steps.

Figure 13:
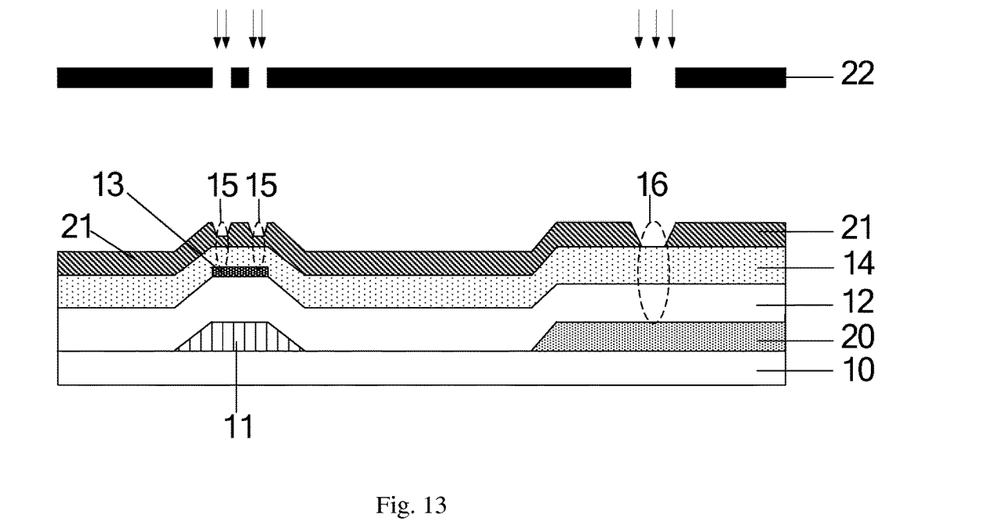
FIG. 13 is a schematic structural view of the array substrate formed in step S051 of FIG. 12.

In step S051, as shown in FIG. 13, photoresist 21 covering the etch stop layer 14 is formed, and the photoresist 21 is exposed by means of a mask 22 and developed to form a photoresist-removed region, a photoresist-retained region, and a photoresist-partially-retained region. The photoresist-removed region is used to form the second via hole 16 correspondingly, and the photoresist-partially-retained region is used to form the first via holes 15 correspondingly. The photoresist 21 may be a high-sensitivity organic film having a thickness of 1.5-3 μm.

Here, a light transmission region of the mask 22 at a position corresponding to the second via hole 16 may have a width of about 10 μm, and another light transmission region of the mask 22 at a position corresponding to the first via hole 15 may have a width of about 8 μm. Within the same time, total degrees of exposure for the first via hole 15 is less than these for the second via hole 16. After the developing process, a part of photoresist will remain within the first via hole 15 to form the photoresist-partially-retained region, while photoresist within the second via hole 16 is completely removed and thus a portion of the etch stop layer 14 within the second via hole 16 is completely exposed.

Figure 14:
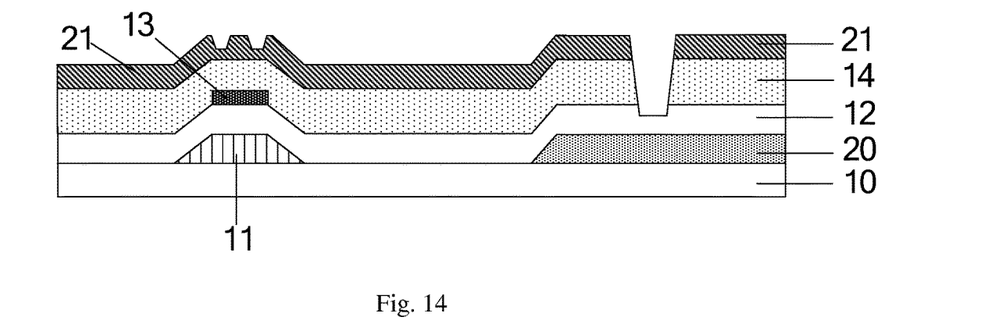
FIG. 14 is a schematic structural view of the array substrate formed in step S052 of FIG. 12.

In step S052, as shown in FIG. 14, the portion of the etch stop layer 14 at the second via hole is etched. Here, etching time is accurately controlled. As shown in FIG. 11, a portion of the gate insulating layer 12 at the second via hole may also be over-etched by a small amount.

Figure 15:
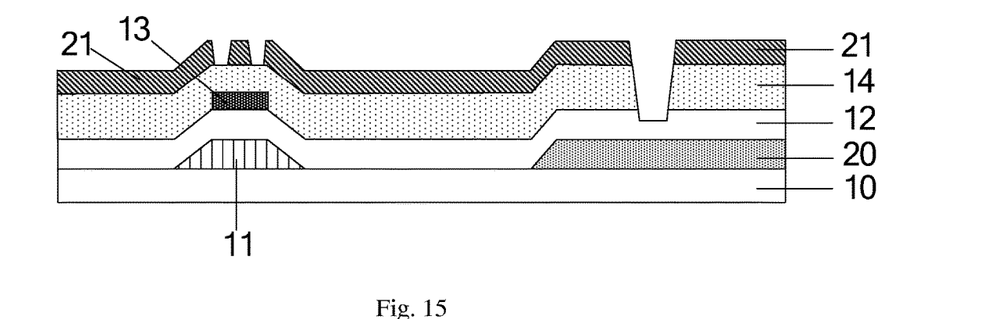
FIG. 15 is a schematic structural view of the array substrate formed in step S053 of FIG. 12.

In step S053, as shown in FIG. 15, an ashing process is performed on the photoresist 21, to remove a portion of the photoresist 21 at the first via hole 15. Ashing time is accurately controlled so that the portion of the etch stop layer 14 at the first via hole is completely exposed.

Figure 16:
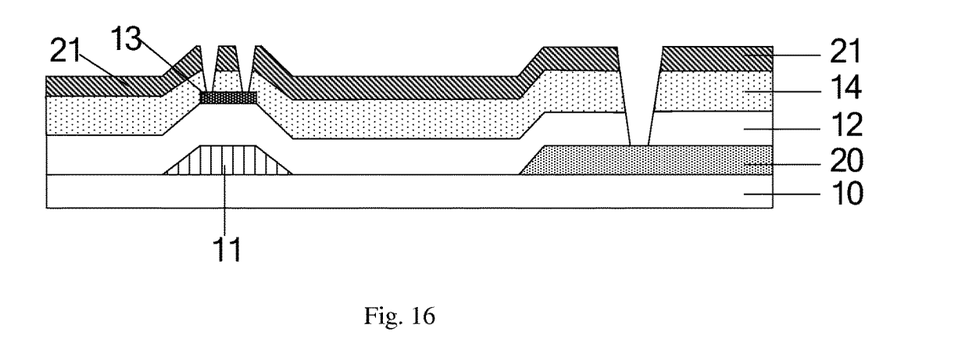
FIG. 16 is a schematic structural view of the array substrate formed in step S054 of FIG. 12.

In step S054, as shown in FIG. 16, the portion of the etch stop layer 14 at the first via hole 15 and a portion of the gate insulating layer 12 at the second via hole 16 are etched.

In step S055, as shown in FIG. 9, the photoresist 21 is peeled off. The first via holes 15 and the second via hole 16 are formed on the substrate 10.

Embodiments of the present invention provide a display apparatus comprising any one of the above-mentioned array substrates. The display apparatus may comprise any display devices such as a liquid crystal display, an electronic paper, and an OLED display; and any products or parts including these display devices and having display function, such as a TV, a digital camera, a mobile phone, and a tablet computer.

Specifically, the display apparatus may comprise a base substrate, a package substrate, and supports between the base substrate and the package substrate, wherein the base substrate comprises a thin film transistor and an OLED which are formed on a substrate in sequence, and the package substrate comprises a Black Matrix (BM), for preventing light leakage between adjacent pixels, and a color filter, which are formed on a transparent substrate in sequence. The display apparatus is of a top-emitting structure. In other words, light of the OLED is emitted outwards from the package substrate.

Alternatively, the display apparatus may comprise a base substrate and a package substrate, and the base substrate and the package substrate directly adhere to each other, by means of frame sealing adhesive, without any butted joint. The base substrate comprises a thin film transistor, a low-temperature color filter made of particular material by particular technology, and an OLED, which are formed on a substrate in sequence. The OLED may also be provided with a filler to block spread of water and oxygen. The display apparatus is of a bottom-emitting structure. In other words, light of the OLED is emitted outwards from the base substrate.

Embodiments of the present invention provide an array substrate and a manufacturing method thereof, and a display apparatus. In the embodiments of the present invention, a dimensional relationship between the maximal diameter of the first via hole and the minimal diameter of the second via hole is set such that a diameter of the second via hole is greater than a diameter of the first via hole, thereby avoiding the problem that the first via holes are over-etched for a long time so as to result in failure of the thin film transistor when the first via holes and the second via hole are formed by simultaneously etching by means of a single mask. Specifically, since the diameter of the first via hole is relatively small, when ultraviolet ray is irradiated onto the first via hole during exposing, diffraction will easily occurs so that exposing energy is decreased. Therefore, within the same time, degree of exposure of the first via hole is less than that of the second via hole. Then, a developing process is performed. Since the diameter of the first via hole is relatively small, developing solution that takes part in reaction within the first via hole is less so that the reaction is not complete. As a result, due to the abovementioned two reasons, a small amount of photoresist will remain within the first via hole after being subjected to the developing process. However, since the diameter of the second via hole is relatively great, a portion of the etch stop layer within the second via hole is completely exposed after being subjected to the developing process. Next, the exposed portion of the etch stop layer within the second via hole is etched. After that, an ashing process is performed to remove the photoresist remaining within the first via hole. Finally, a portion of the etch stop layer within the first via hole and a portion of the gate insulating layer within the second via hole are etched simultaneously, thereby avoiding the problem that the first via hole is over-etched for a long time so as to result in failure of the thin film transistor when the first via hole and the second via hole are formed by simultaneously etching by means of a single mask.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

What is claimed is:

1. An array substrate comprising:
a substrate, and a first thin film transistor and a first electrode which are formed on the substrate, the first thin film transistor comprising: a gate, a gate insulating layer, an active layer, an etch stop layer, and a source and a drain which are located on the etch stop layer, wherein:
the etch stop layer is formed of SiOx and is formed with first via holes, and the source and the drain are electrically connected to the active layer through the first via holes; the etch stop layer and the gate insulating layer cover the first electrode, and are formed with a second via hole at a position corresponding to the first electrode; and a maximal diameter of the first via holes is not greater than a minimal diameter of the second via hole; and the first and second via holes are tapered via holes; and
the maximal diameter of the first via holes is greater than 0 and is less than or equal to 8 µm, and a difference between the minimal diameter of the second via hole and the maximal diameter of the first via holes is not less than 2 µm; or
the maximal diameter of the first via hole is greater than 8 µm and less than or equal to 14 µm, and a ratio of the minimal diameter of the second via hole to the maximal diameter of the first via holes is not less than 1.3.

2. The array substrate of claim 1, wherein:
the maximal diameter of the first via holes is in a range of 3-8 µm.

3. The array substrate of claim 2, wherein:
the maximal diameter of the first via holes is 3 µm, and the minimal diameter of the second via hole is 5 µm; or
the maximal diameter of the first via hole is 8 µm, and the minimal diameter of the second via hole is 10 µm.

4. The array substrate of claim 1, wherein:
the array substrate further comprises a second thin film transistor, and the first electrode is a gate of the second thin film transistor, and the source of the first thin film transistor is electrically connected to the first electrode through the second via hole.

5. The array substrate of claim 1, wherein:
the active layer is formed of a material selected from the group consisting of oxide, oxynitride, and phosphide.

6. A display apparatus comprising the array substrate of claim 1.

7. The array substrate of claim 1, wherein:
the maximal diameter of the first via holes is 3 µm, and the minimal diameter of the second via hole is 5 µm; or
the maximal diameter of the first via hole is 8 µm, and the minimal diameter of the second via hole is 10 µm.

8. A method of manufacturing an array substrate, the method comprising:
forming a first thin film transistor and a first electrode on a substrate, wherein the forming the first thin film transistor and the first electrode comprises:
forming a gate, the first electrode, a gate insulating layer, an active layer, and an etch stop layer on the substrate, wherein the etch stop layer is formed of SiOx, and wherein the etch stop layer and the gate insulating layer cover the first electrode;
forming first via holes and a second via hole, wherein the first via holes are formed at positions corresponding to the active layer, and pass through the etch stop layer, and wherein the second via hole is formed at a position corresponding to the first electrode, and passes through the etch stop layer and the gate insulating layer; and forming a source and a drain on the etch stop layer, wherein the source and the drain are electrically connected to the active layer through the first via holes, wherein:

a maximal diameter of the first via holes is not greater than a minimal diameter of the second via hole, and the first and second via holes are tapered via holes; and the maximal diameter of the first via holes is greater than 0 and is less than or equal to 8 μm, and a difference between the minimal diameter of the second via hole and the maximal diameter of the first via holes is not less than 2 μm; or the maximal diameter of the first via holes is greater than 8 μm and less than or equal to 14 μm, and a ratio of the minimal diameter of the second via hole to the maximal diameter of the first via holes is not less than 1.3.

9. The method of claim 8, wherein:

the forming the first via holes and the second via hole comprises:

forming a photoresist covering the etch stop layer;

exposing the photoresist by means of a mask, and developing the exposed photoresist to form a photoresist-removed region, a photoresist-retained region, and a photoresist-partially-retained region, wherein the photoresist-removed region is used to form the second via hole correspondingly, and the photoresist-partially-retained region is used to form the first via holes correspondingly;

etching a portion of the etch stop layer at the second via hole;

performing an ashing process on the photoresist, to remove a portion of the photoresist at the first via holes;

etching a portion of the etch stop layer at the first via holes and a portion of the gate insulating layer at the second via hole; and     peeling off the photoresist.

10. The method of claim 8, wherein:

the source is electrically connected to the first electrode through the second via hole.

11. The method of claim 8, wherein:

the maximal diameter of the first via holes is in a range of 3-8 μm.

12. The method of claim 11, wherein:

the maximal diameter of the first via holes is 3 μm, and the minimal diameter of the second via hole is 5 μm; or the maximal diameter of the first via holes is 8 μm, and the minimal diameter of the second via hole is 10 μm.

* * * * *